United States Patent [19]

Inam et al.

[11] Patent Number: 5,324,714
[45] Date of Patent: * Jun. 28, 1994

[54] GROWTH OF A,B-AXIS ORIENTED PEROVSKITE THIN FILMS OVER A BUFFER/TEMPLATE LAYER

[75] Inventors: Arun Inam, Somerset; Ramamoorthy Ramesh, Eatontown; Charles T. Rogers, Jr., Oceanport, all of N.J.

[73] Assignee: Bell Communications Research, Inc., Livingston, N.J.

[*] Notice: The portion of the term of this patent subsequent to Oct. 13, 2009 has been disclaimed.

[21] Appl. No.: 63,962

[22] Filed: May 19, 1993

Related U.S. Application Data

[62] Division of Ser. No. 531,255, May 31, 1990.

[51] Int. Cl.$^5$ .................. H01L 39/22; H01G 4/10; H01B 12/00
[52] U.S. Cl. .................. 505/190; 365/145; 257/33; 257/35; 505/237
[58] Field of Search .................. 257/33-35; 505/1, 701, 702, 779, 785; 427/62, 63

[56] References Cited

U.S. PATENT DOCUMENTS

| | | | |
|---|---|---|---|
| 4,943,559 | 7/1990 | Severin et al. | 505/701 |
| 4,962,086 | 10/1990 | Gallagher et al. | 505/701 |
| 5,015,492 | 5/1991 | Venkatesan et al. | 427/8 |
| 5,087,605 | 2/1992 | Hegde et al. | 505/1 |
| 5,155,658 | 10/1992 | Inam et al. | 365/145 |

FOREIGN PATENT DOCUMENTS

| | | | |
|---|---|---|---|
| 294285 | 12/1988 | European Pat. Off. | 505/732 |
| 3810243 | 10/1988 | Fed. Rep. of Germany | 505/729 |
| 3236794 | 10/1988 | Japan | 505/729 |
| 2-044782 | 2/1990 | Japan | 505/729 |

OTHER PUBLICATIONS

"Structural Inorganic Chemistry", 1975, 4th ed., A. F. Wells, Clarendon Press, pp. 149-154.
"Control of ZGrowth Direction of Epitaxial YBaCuO Thin Films on SrTiO$_3$-Substrates", G. Linker et al., Solid State Communications, 1989, vol. 69, pp. 249-253.
"Epitaxy and Orientation of Eu$_1$Ba$_2$Cu$_3$O$_{7-y}$ Films Grown in Situ by Magnetron Sputtering", Japanese Journal of Applied Physics, 1989, vol. 28, pp. L981, L983, H. Asano et al.
"Epitaxial Multilayers of YBa$_2$Cu$_3$O$_7$ and PrBa$_2$Cu$_3$O$_7$ As a Possible Basis for Superconducting ELectronic Devices," U. Poppe et al, Solid State Communications, vol. 71, No. 7, pp. 569-572, 1989.

*Primary Examiner*—Rolf Hiller
*Assistant Examiner*—Mahshid Saadat
*Attorney, Agent, or Firm*—Leonard Charles Suchyta; James W. Falk

[57] ABSTRACT

A method, and the resulting structure, of growing a superconducting perovskite thin film of, for example, YBa$_2$Cu$_3$O$_{7-x}$. A buffer layer of, for example, the perovskite PrBa$_2$Cu$_3$O$_{7-y}$, is grown on a crystalline (001) substrate under conditions which favor growth of a,b-axis oriented material. Then the YBa$_2$Cu$_3$O$_{7-x}$ layer is deposited on the buffer layer under changed growth conditions that favor growth of c-axis oriented material on the substrate, for example, the substrate temperature is raised by 110° C. However, the buffer layer acts as a template that forces the growth of a,b-axis YBa$_2$Cu$_3$O$_{7-x}$, which nonetheless shows a superconducting transition temperature near that of c-axis oriented films.

4 Claims, 3 Drawing Sheets

GROWTH OF A,B-AXIS ORIENTED PEROVSKITE THIN FILMS OVER A BUFFER/TEMPLATE LAYER

This is a division of application Ser. No. 07/531,255, filed May 31, 1990.

FIELD OF THE INVENTION

The invention relates generally to the growth of perovskite materials. In particular, the invention relates to the growth of perovskite superconductors, such as $YBa_2Cu_3O_{7-x}$, with controlled crystalline orientation.

BACKGROUND OF THE INVENTION

The discovery of high-temperature superconductors, commonly called high-$T_c$ superconductors, promises many technological applications. Although many types of low-$T_c$ superconducting devices are known, it has been difficult to fabricate high-$T_c$ equivalents. The highly anistropic properties and complex perovskite crystal structure of most high-$T_c$ superconductors have contributed to this difficulty. This following discussion will use $YBa_2Cu_3O_{7-x}$, hereinafter called YBCO, as an example since it appears to be the most understood as well as technologically usable high-$T_c$ superconductor.

The crystal structure YBCO, illustrated in FIG. 1, is very closely related to the perovskite crystal structure, namely, an orthorhombic (or rectangular) structure with nearly equal a- and b-axes but a significantly longer c-axis. Unit cell parameters for YBCO, as well as those for $SrTiO_3$, a popular substrate for growing YBCO thin films, are given in Table 1.

TABLE 1

| | Lattice Parameters (nm) | | |
|---|---|---|---|
| | a | b | c |
| YBCO | 0.382 | 0.388 | 1.168 |
| PrBCO | 0.387 | 0.393 | 1.171 |
| SrTiO | 0.391 | 0.391 | 0.391 |

Arranged perpendicularly to the c-axis are planes of $CuO_2$, which are believed to be largely responsible for the superconductivity. The perovskite crystal structure if described by A. F. Wells in his book entitled "Structural Inorganic Chemistry," 4th ed., Clarendon Press, 1975 at pages 149-154.

The elongated and non-symmetric unit cell has caused difficulty in growing monocrystalline samples of YBCO. Nonetheless, many techniques have found increasing success. One of the most successful has been pulsed laser deposition in the growth of YBCO thin films. Details of the technique have been disclosed by Venkatesan et al. in U.S. patent application, Ser. No. 07/331,795, filed Apr. 3, 1989, now U.S. Pat. No. 5,015,492, issued May 14, 1991, and by Hegde et al. In U.S. patent application, Ser. No. 07/360,909, filed Jun. 1, 1989, now U.S. Pat. No. 5,087,605, issued Feb. 11, 1992. In this technique, an ultraviolet laser delivers short light pulses onto the surface of a composite target having a composition similar to that of the desired film. The plume of the non-equilibrium evaporation from the target falls on the substrate and forms the desired YBCO film. With careful control of the substrate temperature and ambient oxygen pressure, monocrystalline films can be grown on (001) oriented substrates of $SrTiO_3$, MgO, and other materials. Such oriented substrates have surface unit cells closely matching the a- and b-axis lattice parameters of YBCO. The YBCO films grown by this method had a c-axis orientation perpendicular to the substrate. These films have demonstrated transition temperatures $T_c$ in the range of 90° C.

Hegde et al. further used this c-axis epitaxial growth to form an epitaxial heterostructure of YBCO—PrBCO—YBCO. The middle layer was $PrBa_2Cu_3O_{7-y}$, which is also a perovskite but is non-superconducting and behaves like a semiconductor. Its lattice parameters are also given in Table 1. Their intent was to form a Josephson weak link across the PrBCO, that is, between the YBCO layers across the PrBCO layer. Josephson devices produced using this method reproducibly demonstrated S—N—S (superconductor—normal-metal—superconductor) behavior in their current-voltage characteristics. Both DC and AC Josephson effects were observed. However, the performance of such c-axis grown heteroepitaxial devices is limited by the very short coherence length along this crystallographic direction. The coherence length, one of the key length parameters in superconductivity, is highly anisotropic in YBCO, as well as other known high-$T_c$ superconductors. The coherence length has a value $\xi_c \approx 0.7$ nm along the c-direction and a value $\xi_{a,b} \approx 3.5$ nm within the a-b plane of YBCO. As a result, the coherence length in c-axis oriented YBCO—PrBCO-YBCO heterostructures is smaller than the smallest spacing that can be ideally achieved, specifically, a single unit-cell layer of PrBCO separating two layers of YBCO. It thus appears that even with ideal interfaces between YBCO and PrBCO, the performance of such c-axis oriented junctions will be limited.

On the other hand, the coherence length $\xi_{a,b}$ of $\sim 3.5$ nm along the a- and b-directions of YBCO is nearly ten times the corresponding lattice parameters of PrBCO and YBCO. If heteroepitaxial structures could be grown with the c-axis lying within the film plane, they would provide a much wider latitude in the quality of the PrBCO barrier and of the YBCO—PrBCO interfaces. Even if the PrBCO barrier would be a few unit cells thick in the a,b-directions, there would still be sufficient overlap of the order parameters of the two YBCO electrodes.

In view of these potential advantages, many groups have attempted to grow a,b-axis oriented YBCO films. By a,b-axis oriented films is meant a film in which nearly all the material has its c-axis lying in the plane of the film. One approach to growing a,b-axis oriented perovskite films uses (110)-oriented substrates. A second approach simply lowers the substrate growth temperature by about 100° C. At the lower temperatures, even on a (001) substrate, a large fraction of the YBCO forms in an a,b-axis orientation although there is some mixture with c-axis orientation.

Problems arise with both these approaches. In either case, the films back homogeneity in their orientation along a particular direction. X-ray diffraction has shown that for both these processes, it is difficult to obtain films which are purely a-axis oriented or b-axis oriented. Other phases are almost always locked in. Furthermore, both processes produce a poorly crystalline structure. Regardless of orientation, the crystalline structure must be highly ordered to permit the epitaxial growth of overlayers, such as the PrBCO barrier or the YBCO counter-electrode. So far, there has been no convincing demonstration of epitaxial growth on top of a,b-axis oriented films previously grown on (110) or (001) substrates at the lower deposition temperatures.

Finally, the temperature range in which a,b-axis oriented growth is induced on these substrates is usually below the optimal deposition temperature required to obtain the ~90° C transition temperature achievable in c-axis oriented YBCO. Thus, efforts have failed in obtaining a,b-axis oriented films exhibiting good crystalline structure with a $T_c$ above the 60°–70° K range.

It would be further preferred to achieve a,b-axis oriented growth on (001) substrates, which to date have yielded the best c-axis oriented films. Thereby, a commonly oriented substrate would provide greater flexibility in designing devices incorporating films and heterostructures of both orientations.

The problem of a short c-axis coherence length is present, as well, in the bismuth and thallium superconductors represented by the formula $A_2B_2Ca_{2n-1}Cu_nO_y$, where A is either Bi or Tl, B is either Ba or Sr, n=1, 2, or 3, and y is between 6 and 10. These perovskite materials are of technological interest because they manifest significantly higher values of $T_c$; however, their c-axis lattice parameters are also significantly longer.

SUMMARY OF THE INVENTION

Accordingly, an object of the invention is to provide an a,b-axis oriented perovskite material.

A further object of the invention is to grow an a,b-axis oriented perovskite superconductor without lowering the superconducting transition temperature from that of the c-axis orientation.

A still further object of the invention is to grow a,b-axis oriented films on substrates, including (001) substrates, most suitable for c-axis growth.

Another object of the invention is to provide a,b-axis oriented superconducting/insulating heterostructures such as those required for S—I—S (superconductor—insulator—superconductor) and S—N—S devices.

The invention can be summarized as a product and method of growing an a,b-axis oriented perovskite, such as a superconductor, on a thin-film template of the same or similar material grown at a temperature and other conditions that favor a,b-axis oriented growth. However, the superconductor is grown at the temperature and other conditions that favor the formation of the highest $T_c$ phase and usually yield c-axis oriented films. Nonetheless, it forms on the template in an a,b-axis orientation and manifest a high $T_c$. When the overlying perovskite is the superconductor YBCO, the template is preferably PrYBaCuO or PrBaCuO, a non-superconductor.

DETAILED DESCRIPTION

Figure 2:
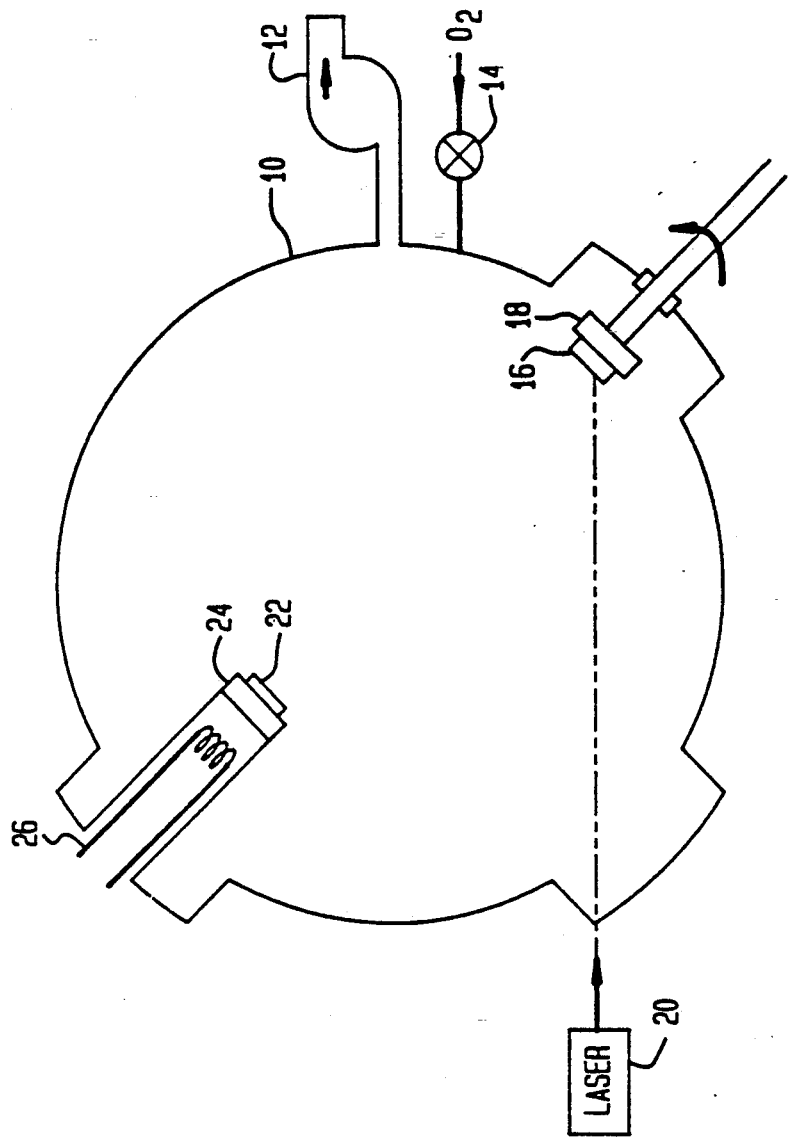
FIG. 2 is a schematic diagram of the laser deposition system used in practicing one embodiment of the invention.
Figure 1:
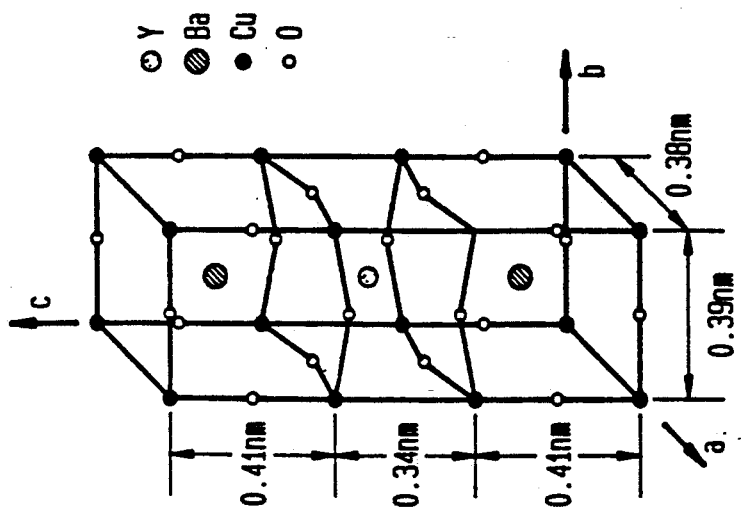
FIG. 1 is a perspective view of the crystalline unit cell of YBCO.

Pulsed layer deposition provides superior quality YBCO ($YBa_2Cu_3O_{7-x}$) films and has been used in demonstrating the present invention. A laser deposition growth system is illustrated in the schematic diagram of FIG. 2. A vacuum chamber 10 is pumped by a vacuum pump 12. However, the chamber pressure is held at a relatively high partial pressure of oxygen with $O_2$ bled in through a metering valve 14. A homogeneous target 16, having a composition matching that of the film to be grown, is mounted on a rotatable target holder 18. An unillustrated carousel mounting multiple rotating targets is used when a multilayer structure of differing compositions is to be grown in situ. A pulsed ultraviolet laser 20 produces a beam that repetitively strokes the rotating target so as to evaporate a portion of the target 16 in a non-equilibrium process. In the examples described below, the laser 20 was an eximer laser emitting 30 ns pulses of coherent light at a wavelength of 248 nm. The pulse rate was 5 Hz and the energy density on the target 16 was 1.5 J/cm². The plume from the evaporated material falls upon a substrate 22 held on a substrate holder 24 located a few centimeters from the target 16. The substrate holder 24 is controllably heated with an electrical coil 26. An unillustrated thermocouple measures the temperature of the substrate holder 24. The substrate holder temperature is about 100° C. higher than that the surface of the substrate 22 itself. General details of the growth procedure have been disclosed in the patent applications to Hegde et al. and to Venkatesan et al., both incorporated herein by reference.

PRELIMINARY EXPERIMENTS

The apparatus of FIG. 2 was used to grow homogeneous films, of either YBCO or PrBCO ($PrBa_2Cu_3O_{7-x}$), on (001) oriented substrates of $SrTiO_3$ or $LaAlO_3$. These substrate materials were likewise cubic or rhombohedral perovskites with a c-axis orientation. The growth rate was about 0.1 nm per pulse from stoichiometric targets 16 of YBCO and of PrBCO. The oxygen partial pressure was maintained at 100 millitorr. The substrate heater temperature was varied between the films.

Figure 3:
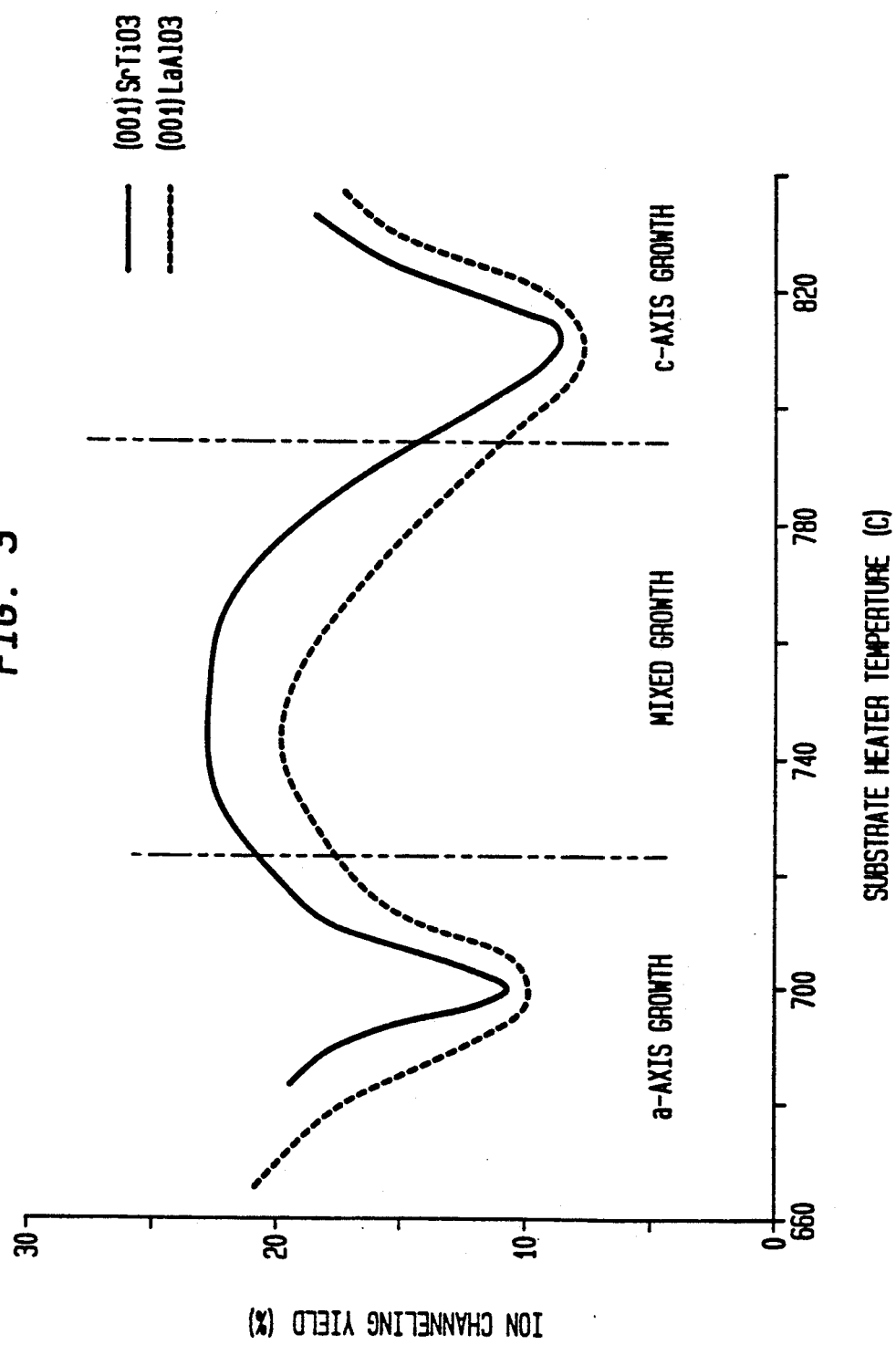
FIG. 3 is a graph illustrating the dependence of crystallographic orientation on growth conditions.

Rutherford back scattering experiments performed on the fabricated films produced the minimum yields illustrated in FIG. 3. A low value of minimum yield indicates a good crystallinity. The valleys near 810° C. for PrBCO on either $SrTiO_3$ or $LaAlO_3$ correspond to previously known results for YBCO and represent highly crystalline films with a c-axis orientation. The data for YBCO, not illustrated here, show the same 810° C. valleys. Other researchers have reported the existence of partially a,b-axis oriented YBCO at lower temperatures. The valleys for PrBCO near 700° C. have not been reported before. X-ray diffusion demonstrated that the 700° C. films did not have c-axis orientation. Transmission electron microscope (TEM) results indicate that the 700° C. films have their c-axis lying within the plane of the film. Therefore, we conclude that c-axis oriented PrBCO growth is thermodynamically favorable on the bulk substrates at 810° C. and a,b-axis oriented growth is favorable at 700° C. Both of these temperatures have a range of about ±10° C. The relatively high minimum yield for intermediate growth temperatures indicate a mixture of c-axis and a,b-axis oriented growth.

The superconducting transition temperature $T_c$ has been measured for a similar series of YBCO films. For c-axis oriented films, the YBCO transition temperature generally inversely follows the higher-temperature PrBCO minimum yield data of FIG. 3. Transition temperatures above 90° K were measured for YBCO over a substrate temperature range of ±20° C. around 810° C. However, the best transition temperatures of $T_c \approx 92°$ were obtained only within a ±5° C. range. At a substrate temperature of 710° C., the transition temperatures were degraded to near 60° K.

A further series of bilayer films were grown, each film consisting of a bottom layer of PrBCO and a top layer of YBCO, both layers being grown under the same conditions described above for the homogeneous films. TEM micrographs showed that PrBCO had a tendency to partially nucleate as a,b-axis oriented material if the growth conditions were not completely optimal for c-axis oriented growth. Importantly, the micrographs further showed that the a,b-axis orientation of the PrBCO then propagated into the overlying layer of YBCO even at deposition conditions which favored c-axis oriented growth for YBCO. As a result, the a,b-axis oriented portions of the PrBCO layer were acting as a template for the later grown YBCO and forcing it to be oriented along its a,b-axis even for growth conditions thermodynamically favoring c-axis growth.

Although these experiments used perovskite substrates of $SrTiO_3$ and $LaAlO_3$, epitaxial perovskite films are known to form on many different substrates, including cubic crystals like MgO.

EXAMPLE 1

Figure 4:
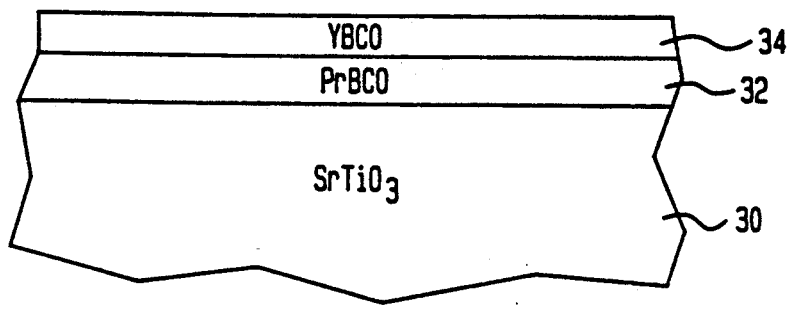
FIG. 4 is a cross-section of a bilayer heterostructure of one embodiment of the invention.

In one example of the invention, layers of PrBCO and YBCO were sequentially grown at different growth temperatures on a (001) oriented substrate 30 of $SrTiO_3$, illustrated in cross-section in FIG. 4. A bottom layer 32 of PrBCO was grown at a substrate holder temperature of 700° C., using a target of PrBCO. The layer 32 was grown to a thickness of 0.1 μm. Immediately following the PrBCO deposition, the substrate holder temperature was raised to 810° C. the carousel moved a YBCO target into the laser beam. Then, a 0.1 μm thick layer 34 of YBCO was grown at this raised temperature. The length of time between growths of the YBCO and PrBCO layers was about 5 min with the oxygen pressure being maintained at 100 millitorr. Thus, the bilayer structure was grown in situ. Following the bilayer deposition, the film was cooled to room temperature in 200 torr of $O_2$.

X-ray diffraction showed that there was no c-axis orientation in the bilayer film but the a,b-axis peaks were not visible because of coindicent substrate peaks. TEM and Raman data were consistent with the c-axis of the bilayer film lying within the plane of the film. Thus, the YBCO grew in an a,b-axis orientation even under environmental conditions favoring c-axis growth. A mutual inductance technique measured the superconducting transition temperature $T_c$ of the YBCO film to be near 83° K. This transition temperature is not greatly depressed from that for films grown with standard c-axis growth conditions.

EXAMPLE 2

In a second example of the invention, the same procedure was followed. However, the YBCO deposition temperature was raised to 830° C. This change raised the transition temperature $T_c$ to 85° K.

The crystallography of the bilayer heterostructures has been studied with high resolution TEM. It appears that the a,b-axis oriented growth is primarily a-axis oriented, that is, the short cell parameter grows epitaxially vertically. Further, the c-axis is distributed in perpendicular domains, which is expected since the c-axis is matched to two approximately square surface unit cells of the substrate and there is no preference between the two perpendicular orientations.

EXAMPLE 3

Figure 5:
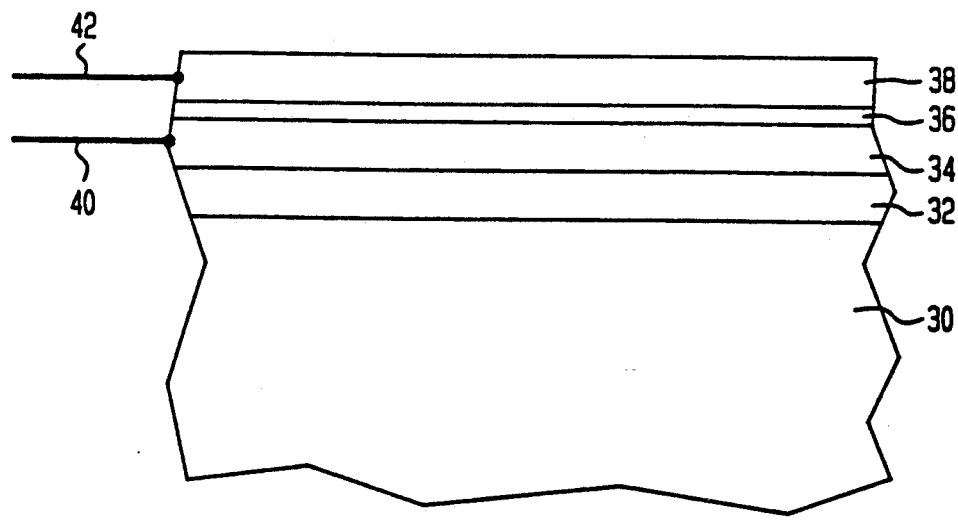
FIG. 5 is a cross-section of a four-layer heterostructure of another embodiment of the invention usable as a Josephson device.

A third example of the invention, illustrated in FIG. 5, was a four-layer heterostructure. Such structures can be processed to form Josephson devices, as disclosed in the patent application of Hegde et al. Following the same procedure as in the first example, the 100 nm thick PrBCO buffer layer 32 was deposited on the (001) $SrTiO_3$ substrate 30 at a temperature of 700° C. The temperature was raised to 810° C. and the 80 nm thick lower YBCO layer 34 was deposited on the buffer layer 32. The temperature was reduced to 700° C. and a 2 nm thick barrier layer 36 of PrBCO was deposited on the lower YBCO layer 34. Then, the temperature was again raised to 810° C. and a 80 nm thick upper YBCO layer 38 was deposited on the barrier layer 36.

By the growth of the two PrBCO layers at the lower temperature, the entire structure should be a-axis oriented. The thickness of the barrier layer 36 is sufficiently small to easily allow weak links to form between the two temperatures. Electrical contacts 40 and 42, only schematically illustrated, may be formed on the YBCO layers 34 and 38 by the method described in the Hegde et al. application.

A buffer layer of PrBCO or PrYBCO is preferred for a superconducting layer of YBCO. PrBCO appears to have a strong tendency to form as a,b-axis oriented films under the correct growth conditions and to form films of high crystalline and surface quality. Furthermore, PrBCO forms a good match with YBCO. Structurally PrBCO differs from YBCO only in the substitution of Pr for Y with very little change in lattice constant. As a result, the interface between YBCO and PrBCO can be nearly defect free and the a,b-axis oriented PrBCO acts as a template for YBCO. The choice of a template material depends on more than closeness of lattice parameters. Even though (001) oriented $SrTiO_3$ is closely lattice matched to a,b-axis oriented YBCO, it does not provide the template-mediated growth of YBCO provided by PrBCO.

The invention is not limited to the embodiments and examples described above. Although YBCO has received the most attention of the high-$T_c$ superconductors, high transition temperatures have also been observed in similar rare-earth barium cuprate superconductors LBCO, where L is one of the lanthanide rare-earth elements, for example, Gd, Dy, Ho, or Tm and including Y. The invention is applicable to all these superconductors to form similar heterostructures with buffer and barrier layers of PrBCO and the praseodymium lanthanide rare-earth barium cuprate alloys PrLBCO. Although PrBCO appears to form an adequate barrier layer, it is a semiconductor rather than an insulator. A perovskite insulator having chemical properties similar to YBCO would be preferred for the barrier material. The invention is also applicable to other perovskite superconductors and to perovskite non-superconductors. For example, thin films of ferroelectric bismuth titanate are desirable.

Although the examples of the invention changed the growth conditions by changing the substrate temperature in pulsed laser deposition, the effect of the template is chemical or thermodynamic. Therefore, the invention can be applied to other growth processes, such as offaxis sputtering, hollow cathode sputtering, electron-beam evaporation, chemical vapor deposition, and molecular beam epitaxy. Furthermore, other growth conditions than substrate temperature can be used to control the thermodynamics and thus the growth orientation. Lower oxygen pressures are known to promote a,b-axis oriented growth. Similarly, other gases such as $N_2O$ may be substituted for $O_2$ to control the orientation. There have been reports that a 50× to 100× increase in the deposition rate over normal c-axis growth rates also promotes a,b-axis growth. Although bulk substrates have been used in the examples, a substrate for purposes of the invention may be a previously grown thin film, for example, $SrTiO_3$ or c-axis oriented YBCO.

The invention thus provides for the a,b-axis oriented growth of perovskite thin films of controlled orientation, that is, the c-axis lies within the plane of the film. The films can be grown with only minor variations from standard techniques. For the case of YBCO films, the superconducting transition temperature is nearly that for c-axis oriented films. Thereby, when vertical superconducting/normal heterostructures are grown, long coherence lengths extend across the interface from the superconductor to the normal material.

What is claimed is:

1. A superconducting heterostructure, comprising:
    a crystalline substrate;
    a buffer layer of an a,b-axis oriented praseodymium lanthanide rare-earth barium cuprate epitaxially formed over said substrate; and
    a superconducting layer of an a,b-axis oriented lanthanide rare-earth barium cuprate epitaxially formed over said buffer layer.

2. A superconducting heterostructure as recited in claim 1, further comprising:
    a barrier layer of an a,b-axis oriented perovskite epitaxially formed over said superconducting layer; and
    a second superconducting layer of an a,b-axis oriented lanthanide rare-earth barium cuprate epitaxially formed over said barrier layer,
    wherein a superconducting weak link is formed between said superconducting layers across said barrier layer.

3. A superconducting heterostructure, as recited in claim 2, wherein said first and second superconducting layers comprise $YBa_2Cu_3O_{7-x}$ and said buffer layer comprises $Pr_{1-z}Y_zBa_2Cu_3O_{7-y}$, wherein $0 \leq z < 1$.

4. A superconducting heterostructure, as recited in claim 2, wherein said barrier layer comprises a praseodymium lanthanide rare-earth barium cuprate.

* * * * *